(12) United States Patent
Wu et al.

(10) Patent No.: US 9,229,065 B2
(45) Date of Patent: Jan. 5, 2016

(54) DETECTION APPARATUS FOR LIGHT-EMITTING DIODE CHIP

(71) Applicant: GENESIS PHOTONICS INC, Tainan (TW)

(72) Inventors: Tai-Wei Wu, Tainan (TW); Tai-Cheng Tsai, Tainan (TW); Hsin-Hung Lin, Tainan (TW); Ping-Tsung Tsai, Tainan (TW); Pei-Yi Huang, Tainan (TW); Gwo-Jiun Sheu, Tainan (TW); Shou-Wen Hsu, Tainan (TW); Yun-Li Li, Tainan (TW)

(73) Assignee: Genesis Photonics Inc., Tainan (TW)

( * ) Notice: Subject to any disclaimer, the term of this patent is extended or adjusted under 35 U.S.C. 154(b) by 469 days.

(21) Appl. No.: 13/836,181

(22) Filed: Mar. 15, 2013

(65) Prior Publication Data
US 2014/0159732 A1      Jun. 12, 2014

(30) Foreign Application Priority Data

Dec. 10, 2012   (TW) ............................ 101146326 A

(51) Int. Cl.
*G01J 1/00* (2006.01)
*G01R 31/44* (2006.01)
*G01R 31/26* (2014.01)
*G01J 1/42* (2006.01)

(52) U.S. Cl.
CPC ............ *G01R 31/44* (2013.01); *G01R 31/2635* (2013.01); *G01J 2001/4252* (2013.01)

(58) Field of Classification Search
CPC ................. G01J 2001/4252; G01J 2001/4247; G01R 31/2635
USPC .................................................. 356/213, 218
See application file for complete search history.

(56) References Cited

U.S. PATENT DOCUMENTS

2013/0015859 A1* 1/2013 Tseng ................ G01R 31/2635
                                                              324/414

* cited by examiner

*Primary Examiner* — Thanh Luu
(74) *Attorney, Agent, or Firm* — Muncy, Geisseler, Olds & Lowe, P.C.

(57) ABSTRACT

A detection apparatus for light-emitting diode chip comprising a substrate with the function of photoelectric conversion and a probing device is disclosed. The substrate is designed to bear at least one light-emitting diode chip. The probing device comprises a power supply and at least two conductive elements. The two ends of the conductive elements are respectively electrically connected to the light-emitting diode chip and the power supply to enable the light-emitting diode chip to emit light beams. Some of the light beams are emitted from the light-emitting diode chip toward the substrate such that the light beams emitted by the light-emitting diode chip are converted into an electric signal by the substrate.

13 Claims, 3 Drawing Sheets

DETECTION APPARATUS FOR LIGHT-EMITTING DIODE CHIP

CROSS-REFERENCE TO RELATED APPLICATION

This application claims priority from Taiwan Patent Application No. 101146326, filed on Dec. 10, 2012, the contents of which are hereby incorporated by reference in their entirety for all purposes.

BACKGROUND OF THE INVENTION

1. Field of the Invention

The present invention relates to a detection apparatus, and particularly, to a detection apparatus for detecting a light-emitting diode chip.

2. Description of the Related Art

Due to the technology improvements and the elevation of life quality, modern people pay more and more attention to illumination. From the ancient illumination measures of burning material, such as fire torches, vegetable oil lamps, candles, and kerosene lamps, of using electricity, such as incandescent lamps and fluorescent lamps, to the modern light-emitting diode (LED), it all shows that illumination plays an important role in people's ordinary life.

By combining the electrons and electronic holes, light-emitting diode emits light to provide illumination or alerting. Compared with the traditional light sources, the light-emitting diode has the advantages of high light-emitting efficiency, long service life, robust, fast response time, etc. In recent years, due to the great promotion of governments and the increasing scale of the light-emitting diode street lamps in cities, using light-emitting diode as the illumination source is available everywhere.

Generally, a probe device is used to test the luminous efficiency of the light-emitting diode chips. The probe device provides a power source through the probe pins to enable a light-emitting diode chip to emit light beams, and the light beams are then collected by a light-sensing device of the probe device such that the luminous efficiency of the light-emitting diode chip could be determined. However, when using the probe device, the complication and the detection time of detecting the light-emitting diode chip are increased because user has to select an appropriate light-sensing device to detect the luminous efficiency of the light-emitting diode chip, and in practically operated, user has to adjust the opposite position between the light-sensing device and the light-emitting diode chip to achieve the object of collecting light completely. Besides, the light loss would be caused owing to the light refraction of the pathway of the light beams passing from the chuck to the light-sensing device such that the accuracy of detecting the luminous efficiency of the light-emitting diode chip is influenced.

SUMMARY OF THE INVENTION

In view of the foregoing problems of the prior arts, one of the objects of the present invention is to provide a detection apparatus for light-emitting diode chip to reduce the complication and the detection time of detecting the light-emitting diode chip.

According to another object of the present invention, the present invention provides a detection apparatus for light-emitting diode chip to increase the accuracy of detecting the light-emitting diode chip.

To fulfill the aforementioned objects, the present invention provides a detection apparatus for light-emitting diode chip, which comprises a substrate with the function of photoelectric conversion and a probing device. The substrate is designed to bear at least one light-emitting diode chip. The probing device comprises a power supply and at least two conductive elements, and two ends of the conductive elements are respectively electrically connected to the light-emitting diode chip and the power supply to enable the light-emitting diode chip to emit light beams. Additionally, some of the light beams are emitted from the light-emitting diode chip toward the substrate such that the light beams emitted by the light-emitting diode chip are converted into an electric signal by the substrate. Wherein the substrate is a solar panel or a photodetector array, and the solar panel is an amorphous solar panel or a III-V solar panel, and the photodetector array is an array of photoelectric diodes, charge coupled devices (CCDs), light dependent resistances, quantum optical detectors, photoelectric gates, phototransistors, or photoconductors.

Additionally, the area of the substrate is substantially larger than the light-emitting diode chips or the array distribution area of the light-emitting diode chips. Preferably, the area of the substrate is larger than $[(L+2H \tan(\theta/2)] \times [W+2H \tan(\theta/2)]$, wherein L is the length of the light-emitting diode chip, W is the width of the light-emitting diode chip, H is the height of the light-emitting diode chip, and $\theta$ is the biggest light-emitting angle of the light-emitting diode chip toward the substrate.

According to the first preferred embodiment of the present invention, the conductive elements are probe pins.

According to the second preferred embodiment of the present invention, the conductive elements are conductive films, and the conductive films are disposed between the substrate and the light-emitting diode chip. Wherein, the material of the conductive films is indium tin oxide (ITO) or indium zinc oxide (IZO).

According to the third preferred embodiment of the present invention, the conductive elements are conductive films, and the conductive films are disposed over the substrate and the light-emitting diode chip. Wherein, the material of the conductive films is indium tin oxide (ITO) or indium zinc oxide (IZO).

In the first and the third preferred embodiment of the present invention, a film with adhesive property is disposed between the substrate and the light-emitting diode chip, and a grip ring is further disposed on the film to expand the film.

Additionally, in the first, the second, and the third preferred embodiments of the present invention, a reflective film could be disposed on one side of the light-emitting diode chip opposite to the substrate to reflect the light beams or the lateral light beams of the light-emitting diode chip opposite to the substrate. Wherein, the reflective film is a film with reflective index larger than 90% within a range of light wavelength from 300 nm to 700 nm. Preferably, the reflective film is a film with reflective index larger than 90% within a range of visible blue light from 430 nm to 475 nm.

As above-mentioned, the detection apparatus for light-emitting diode chip of the present invention may have one or more characteristics and advantages as described below:

(1) In the detection apparatus for light-emitting diode chip of the present invention, the complication of operating the detection apparatus and the detection time of detecting the light-emitting diode chip are reduced by using the substrate with the function of photoelectric conversion to bear light-emitting diode chip and to detect the luminous efficiency thereof.

(2) In the detection apparatus for light-emitting diode chip of the present invention, the light loss is reduced and the accuracy of detecting the light-emitting diode chip is increased by using the substrate with the function of photoelectric conversion.

DETAILED DESCRIPTION OF THE PREFERRED EMBODIMENTS

The detection apparatus for light-emitting diode chip of the present invention comprises a substrate with the function of photoelectric conversion and a probing device. Wherein, the probing device comprises a power supply and at least two conductive elements. In the embodiments of the present invention, the conductive elements can be, for example, probe pins or conductive films. User could selectively use the probe pins or the conductive films for practical demand to electrically contact to the light-emitting diode chip and provide the light-emitting diode chip with a voltage. However, in the detection apparatus for light-emitting diode chip of the present invention, the conductive elements would not be limited to the probe pins or the conductive films mentioned above, and any conductive elements providing the light-emitting diode chip with an electric voltage to enable the light-emitting diode chip to emit light beams is within the protection scope of the present invention.

Figure 1:
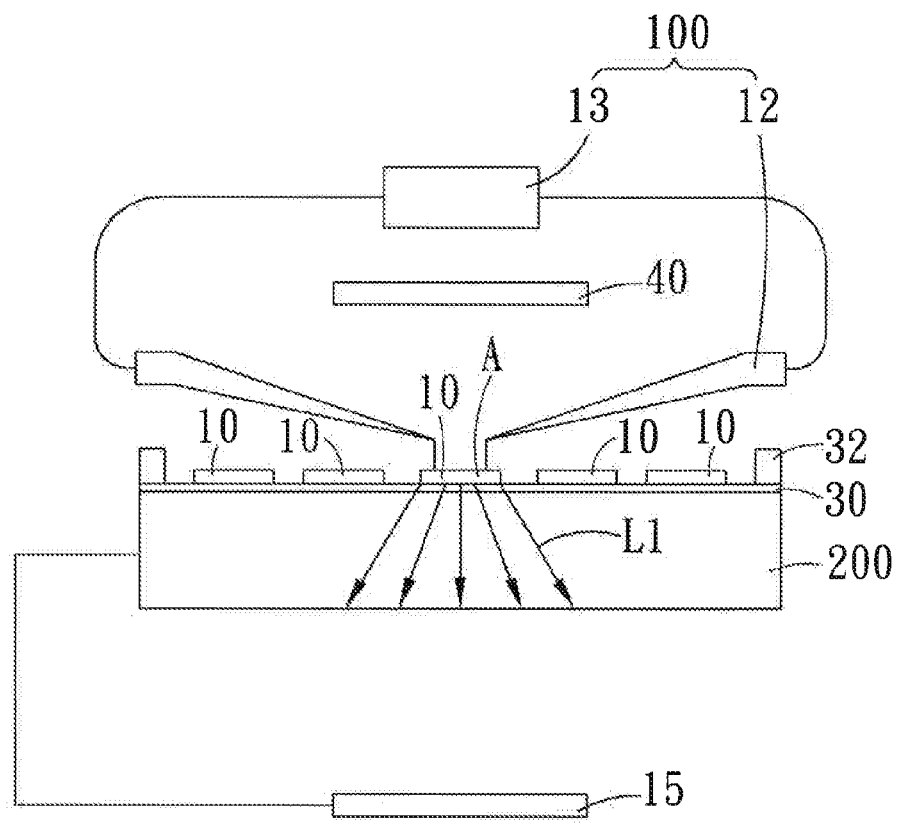
FIG. 1 is a schematic sectional view showing a detection apparatus for a light-emitting diode chip according to a first preferred embodiment of the present invention.

Referring to FIG. 1, it is a schematic sectional view showing a detection apparatus for light-emitting diode chip according to a first preferred embodiment of the present invention. As shown in FIG. 1, the first preferred embodiment of the detection apparatus for light-emitting diode chips of the present invention comprises a substrate 200 with the function of photoelectric conversion and a probing device 100. The substrate 200 is designed to bear a light-emitting diode chip 10 to be detected. The probing device 100 comprises a power supply 13 and at least two conductive elements. In the first preferred embodiment of the present invention, the conductive elements are probe pins 12, and two ends of the probe pins 12 are respectively electrically connected to the light-emitting diode chip A and the power supply 13 to enable the light-emitting diode chip A to receive different voltages and to emit a plurality of light beams L1. Additionally, as shown in FIG. 1, the plurality of light beams L1 is emitted from the light-emitting diode chip A toward the substrate 200 such that the light beams L1 emitted by the light-emitting diode chip A are converted into an electric signal by the substrate 200. Besides, in order to collect the light beams from all directions emitted by the light-emitting diode chip more completely and to increase the detection efficiency, a reflective film 40 is optionally disposed on a light-opposing surface of the light-emitting diode chip A to reflect the light beams from other directions emitted by the light-emitting diode chip A, such as light beams or the lateral light beams of one surface opposite to the substrate. The light beams from other directions are reflected by the reflective film 40 toward the substrate 200 in a direction identical to that of the light beams L1 such that the light beams reflected by the reflective film 40 are converted into an electric signal by the substrate 200.

Figure 2A:
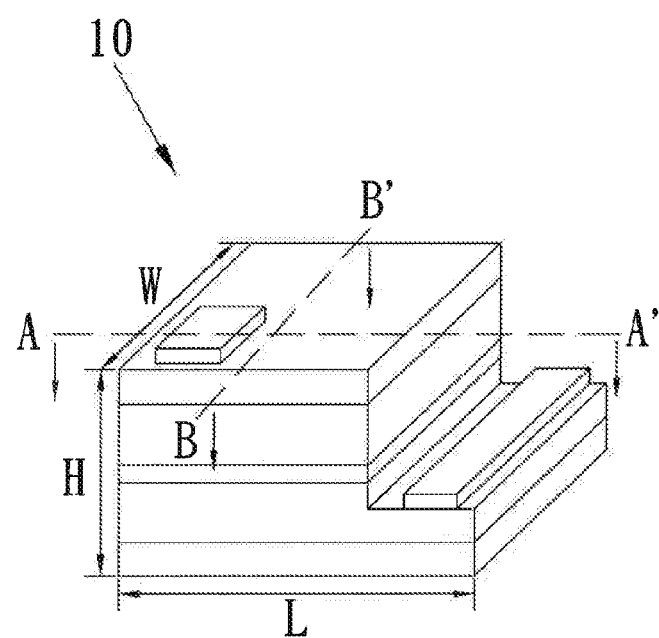
FIG. 2A is a stereoscopic diagram of the light-emitting diode chip.
Figure 2B:
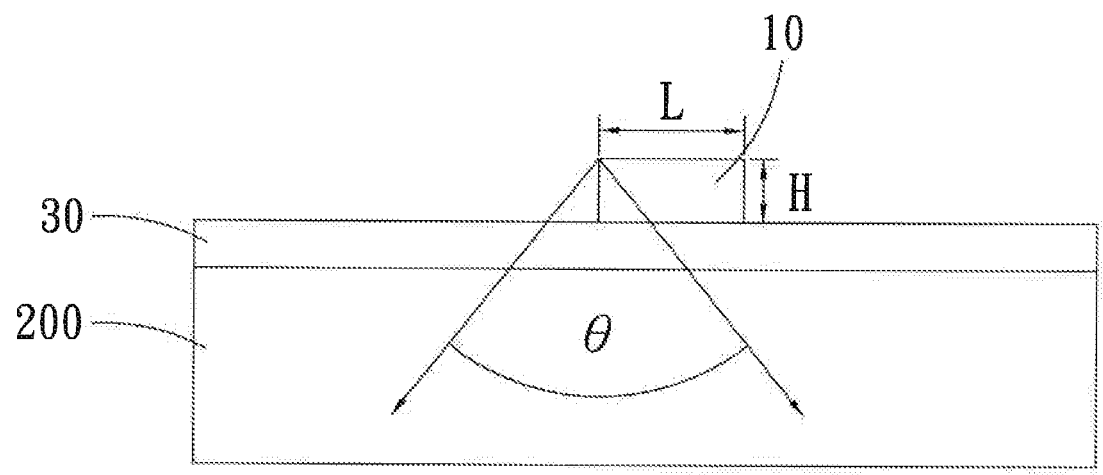
FIG. 2B is a schematic sectional view of the light-emitting diode chip taken along a section line A-A' of FIG. 2A.
Figure 2C:
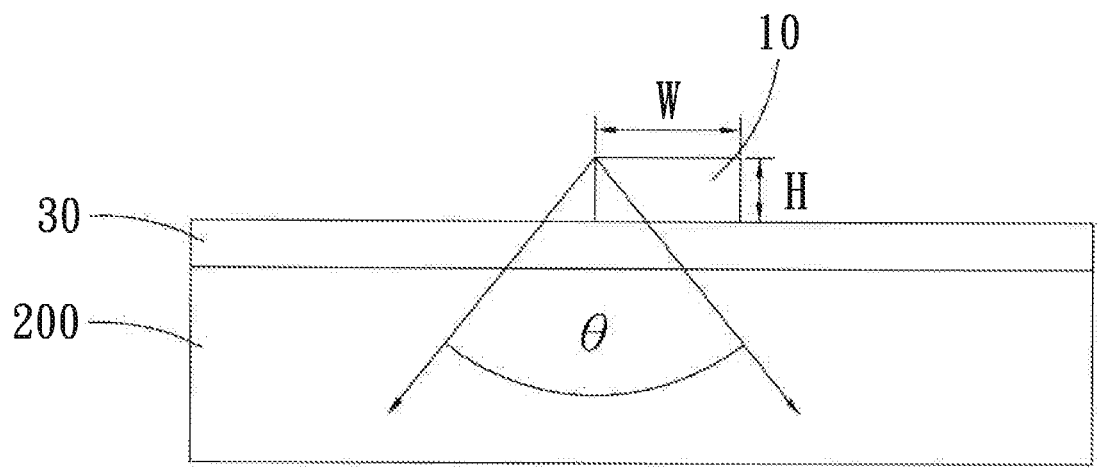
FIG. 2C is a schematic sectional view of the light-emitting diode chip taken along a section line B-B' of FIG. 2A.

Because the luminous efficiency of the light-emitting diode chip is detected by the substrate, which is capable of converting light beams into electric power, the area of the substrate 200 is substantially larger than the light-emitting diode or the array distribution area of the light-emitting diode chips 10 such that the purpose of collecting the light beams emitted by the light-emitting diode chip completely can be achieved. Referring to FIG. 2A, it is a stereoscopic diagram of the light-emitting diode chip 10, and in FIG. 2A, the length of the light-emitting diode chip 10 is L, the width of the light-emitting diode chip 10 is W, and the height of the light-emitting diode chip 10 is H. FIG. 2B is a schematic sectional view of the light-emitting diode chip 10 taken along a section A-A' of FIG. 2A, and FIG. 2C is a sectional view of the light-emitting diode chip 10 taken along a section B-B' of FIG. 2A. Referring to FIG. 2B, the biggest light-emitting angle of the light-emitting diode chip 10 toward the substrate 200 is $\theta$, and for the purpose of collecting the plurality of light beams L1 emitted by the light-emitting diode chip 10 completely being achieved, the length of the substrate 200 should be larger than $[(L+2H \tan(\theta/2)]$. With continued reference to FIG. 2C, the biggest light-emitting angle of the light-emitting diode chip 10 toward the substrate 200 is $\theta$, wherein $0<\theta<180$, and the width of the substrate 200 should be larger than $[W+2H \tan(\theta/2)]$, therefore the area of the substrate 200 should be larger than $[L+2H \tan(\theta/2)] \times [W+2H \tan(\theta/2)]$ to achieve the purpose of collecting the plurality of light beams emitted by the light-emitting diode chip completely. Besides, as shown in FIG. 1 and FIG. 2B-2C, in the first preferred embodiment of the present invention, a film 30 with adhesive property is disposed between the substrate 200 and the light-emitting diode chips 10 to adhere the light-emitting diode chips 10 onto the substrate 200. Wherein, the film 30 can be, for example, a white tape, a blue tape or other film with adhesive property, but not limited thereto. Any film, which is capable of adhering the light-emitting diode chip onto the substrate, is within the protection scope of the present invention. Besides, as shown in FIG. 1, a grip ring 32 can be further disposed on the film 30 to expand the film 30 such that the light-emitting diode chips 10 are arranged immobility on the substrate 200.

As shown in FIG. 1, the first preferred embodiment of detection apparatus for light-emitting diode chip of the present invention is suitable for detecting the luminous efficiency of the light-emitting diode chips 10, the detection procedures are as follows: the light-emitting diode chips 10 are supported by the substrate 200; and a detection process is performed by the probing device 100, wherein the power supply 13 of the probing device 100 provides an electric voltage to the light-emitting diode chip A through the probe pins 12 to enable the light-emitting diode chip A to emit the plurality of light beams L1. Wherein, the plurality of light beams L1 are emitted by the light-emitting diode chip A toward the substrate 200 to enable the plurality of light beams L1 emitted by the light-emitting diode chip A are received by the substrate 200 with the function of photoelectric conversion such that the light beams L1 are converted into an electric signal by the substrate 200. A reflective film 40 is optionally disposed on one side of the light-emitting diode chip A opposite to the substrate 200 to reflect the light beams from other direction emitted by the light-emitting diode chip A, and guiding the light beams from other direction emitted by the light-emitting diode chip A toward the substrate 200, these light beams are converted into an electric signal by the substrate 200. Then, the electric signal is received by the electronic device 15 such that the luminous efficiency of the light-emitting diode chip A is displayed by the electronic device 15.

In the detection apparatus for light-emitting diode chip of the present invention, reflective film 40 can be for example an optical reflective film, a metal reflective film, or a film coated with metal compound such as barium sulfate. The reflective film 40 is a film with reflective index larger than 90% within a range of light wavelength from 300 nm to 700 nm. Wherein, the preferred reflection of the reflective film 40 is within a range of visible blue light from 430 nm to 475 nm. Although the reflective film is only depicted in FIG. 1, but the rest may be deduced by analogy, and the reflective film 40 could be optionally disposed to raise the detection efficiency of the light-emitting diode chip in the second and third preferred embodiments below.

In the detection apparatus for light-emitting diode chip of the present invention, the substrate 200 can be, for example, a solar panel or a photodetector array, and the solar panel can be, for example, an amorphous solar panel or a III-V solar panel, and the photodetector array can be, for example, an array of photoelectric diodes, charge coupled devices, light dependent resistances, quantum optical detectors, photoelectric gates, phototransistors, or photoconductors. However, the substrate 200 with the function of photoelectric conversion is not limited to the solar panel or the photodetector array mentioned above, any substrate performed variations and equivalent modifications is within the protection scope of the present invention.

Figure 3:
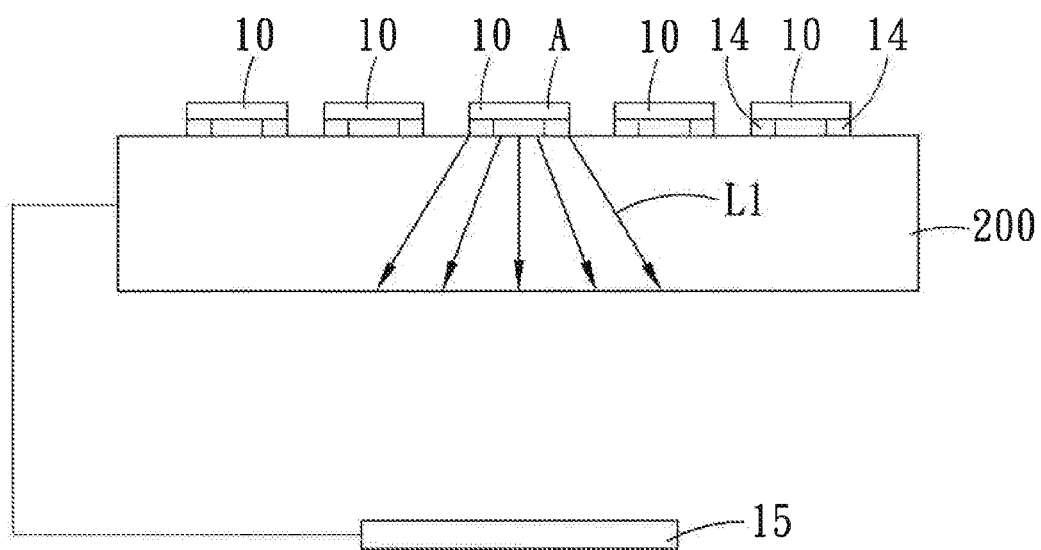
FIG. 3 is a schematic sectional view showing the detection apparatus for light-emitting diode chip according to a second preferred embodiment of the present invention.

In the detection apparatus for light-emitting diode chip of the present invention, the conductive elements can further be conductive films. As shown in FIG. 3, it is a schematic sectional view showing the detection apparatus for light-emitting diode chip according to a second preferred embodiment of the present invention. In the second preferred embodiment of the present invention, the conductive films 14 can be disposed between the substrate 200 and the light-emitting diode chip 10, and each of the conductive films 14 is electrically insulated with the other conductive films 14 next to the conductive films 14 such that different voltages can be received by the light-emitting diode chip 10 electrically connected to these two conductive films 14 to enable the light-emitting diode chip 10 to emit light beams. Wherein, the material of the conductive films 14 can be, for example, indium tin oxide or indium zinc oxide, but not limited thereto.

Beside, the conductive films 14 can be manufactured by methods such as deposition or etching, but not limited thereto. Users can deposit the conductive material such as indium tin oxide or indium zinc oxide on a membrane such that the conductive films 14 with patterns are formed. Otherwise, the conductive films 14 can be formed by users by etching the conductive material such as indium tin oxide or indium zinc oxide.

As shown in FIG. 3, the difference between the second preferred embodiment and the first preferred embodiment of the present invention is that the conductive elements of the second preferred embodiment are conductive films 14. The detection procedures of the second preferred embodiment of the present invention are as follows: the conductive films 14 are disposed on the substrate 200; the light-emitting diode chips 10 are supported by the conductive films 14; and a detection process is performed by the probing device 100, wherein the power supply 13 (not shown in FIG. 3 to enable the figure clean) of the probing device 100 provides an electric voltage to the light-emitting diode chip A through the conductive films 14 to enable the light-emitting diode chip A to emit the plurality of light beams L1. Wherein, the plurality of light beams L1 is emitted from the light-emitting diode chip A toward the substrate 200 to enable the plurality of light beams L1 emitted by the light-emitting diode chip A is received by the substrate 200 with the function of photoelectric conversion such that the light beams L1 are converted into an electric signal by the substrate 200. Besides, the light beams from other directions emitted by the light-emitting diode chip A can be reflected by the reflective film 40 (not shown in FIG. 3 to enable the figure clean) to enable the light beams go toward the substrate 200 such that the light beams reflected by the reflective film 40 are converted into an electric signal by the substrate 200. Then, the electric signal is received by the electronic device 15 such that the luminous efficiency of the light-emitting diode chip A is displayed by the electronic device 15.

Figure 4:
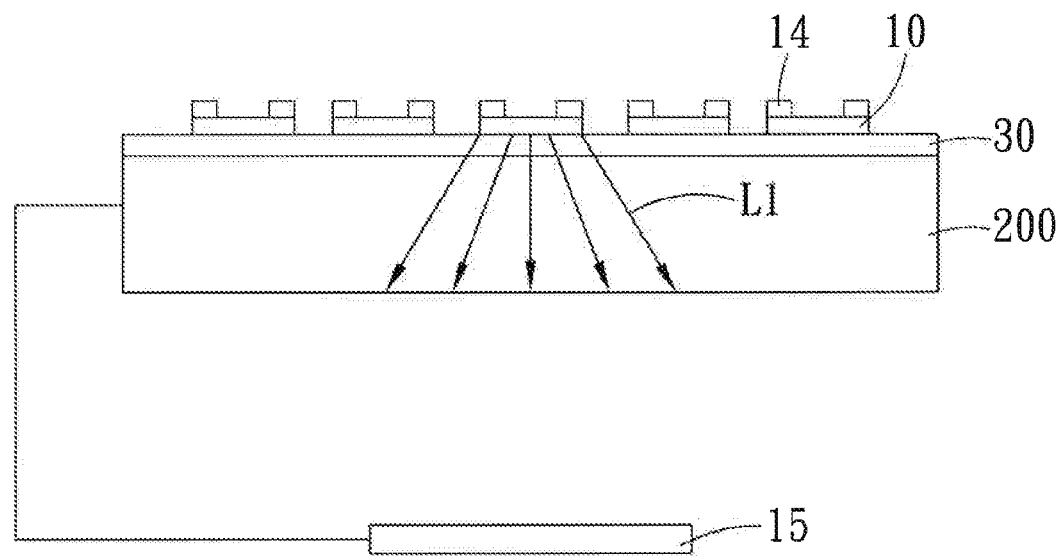
FIG. 4 is a schematic sectional view showing the detection apparatus for light-emitting diode chip according to a third preferred embodiment of the present invention.

Referring to FIG. 4, it is a sectional view showing the detection apparatus for light-emitting diode chip according to the third preferred embodiment of the present invention. As shown in FIG. 4, the conductive elements are conductive films 14. In the third preferred embodiment of the present invention, the conductive films 14 are disposed on the light-emitting diode chips 10, and each of the conductive films 14 is electrically insulated with the other conductive films 14 next to the conductive films 14 such that different voltages can be received by the light-emitting diode chip 10 electrically connected to these two conductive films 14 to enable the light-emitting diode chip 10 to emit light beams. Wherein, the material of the conductive films 14 can be, for example, indium tin oxide or indium zinc oxide, but not limited thereto. Besides, as shown in FIG. 4, in the third preferred embodiment of the present invention, a film 30 with adhesive property is disposed between the substrate 200 and the light-emitting diode chips 10 to adhere the light-emitting diode chips 10 onto the substrate 200. Wherein, the film 30 can be, for example, a white tape, a blue tape or other film with adhesive property, but not limited thereto. Any film adaptable to adhere the light-emitting diode chip onto the substrate is within the protection scope of the present invention. Besides, a grip ring 32 (not shown in FIG. 4 to enable the figure clean) could be further disposed on the film 30 to expand the film 30 such that the light-emitting diode chips 10 are arranged fixedly on the substrate 200.

As shown in FIG. 4, the difference between the third preferred embodiment and the second preferred embodiment of the present invention is the location of the conductive films 14. The detection procedures of the third preferred embodiment of the present invention are as follows: the light-emitting diode chips 10 are supported by the substrate 200; the conductive films 14 are disposed on the light-emitting diode chips 10; and a detection process is performed by the probing device 100, wherein the power supply 13 (not shown in FIG. 4 to enable the figure clean) of the probing device 100 provides an electric voltage to the light-emitting diode chip A through the conductive films 14 to enable the light-emitting diode chip A to emit the plurality of light beams L1. Wherein, the plurality of light beams L1 are emitted by the light-emitting diode chip A toward the substrate 200 to enable the plurality of light beams L1 are received by the substrate 200 with the function of photoelectric conversion such that the light beams L1 are converted into an electric signal by the substrate 200. Besides, the light beams from other directions emitted by the light-emitting diode chip A are reflected toward the substrate 200 by the reflective film 40 (not shown in FIG. 4 to enable the figure clean) such that the light beams reflected by the reflective film 40 are converted into an electric signal by the substrate 200. Then, the electric signal is received by the electronic device 15 such that the luminous efficiency of the light-emitting diode chip A is displayed by the electronic device 15.

In the present invention, the complication and the detection time that user operating the detection apparatus are reduced by using the substrate, which is capable of converting light beams into electric signal, however, in the detection apparatus for light-emitting diode chip of the present invention, the substrate of the present invention is not limited to the figures of the first, the second, and the third preferred embodiments mentioned above.

In summary, the detection apparatus for light-emitting diode chips of the present invention utilizes a substrate with the function of photoelectric conversion to bear light-emitting diode chips and to detect the luminous efficiency thereof such that the complication and the detection time of detecting the light-emitting diode can be reduced and that the efficiency of detecting the light-emitting diode chips can be increased.

In summation, although the present invention has been described with reference to the foregoing preferred embodiment, it will be understood that the invention is not limited to the details thereof. Various equivalent variations and modifications may still occur to those skilled in this art in view of the teachings of the present invention. Thus, all such variations and equivalent modifications are also embraced within the scope of the invention as defined in the appended claims.

What is claimed is:

1. A detection apparatus for light-emitting diode chip, comprising:
    a substrate with the function of photoelectric conversion to bear at least one light-emitting diode chip; and
    a probing device, comprising a power supply and at least two conductive elements each having two ends respectively electrically connected to the light-emitting diode chip and the power supply to enable the light-emitting diode chip to emit light beams,
    wherein some of the light beams are emitted from the light-emitting diode chip toward the substrate such that the light beams emitted by the light-emitting diode chip are converted into an electric signal by the substrate.

2. The detection apparatus for light-emitting diode chip of claim 1, wherein the area of the substrate is substantially larger than the array distribution area of the light-emitting diode chips.

3. The detection apparatus for light-emitting diode chip of claim 2, wherein the area of the substrate is larger than $[L+2H \tan(\theta/2)] \times [W+2H \tan(\theta/2)]$, wherein L is the length of the light-emitting diode chip, W is the width of the light-emitting diode chip, H is the height of the light-emitting diode chip, and $\theta$ is the biggest light-emitting angle of the light-emitting diode chip toward the substrate.

4. The detection apparatus for light-emitting diode chip of claim 1, further comprising a reflective film disposed on one side of the light-emitting diode chip opposite to the substrate.

5. The detection apparatus for light-emitting diode chip of claim 4, wherein the reflective film is a film with reflective index larger than 90% within a range of light wavelength from 300 nm to 700 nm.

6. The detection apparatus for light-emitting diode chip of claim 5, wherein the reflective film is a film with reflective index larger than 90% within a range of visible blue light from 430 nm to 475 nm.

7. The detection apparatus for light-emitting diode chip of claim 1, wherein the conductive elements are probe pins or conductive films.

8. The detection apparatus for light-emitting diode chip of claim 7, wherein the material of the conductive films is indium tin oxide (ITO) or indium zinc oxide (IZO).

9. The detection apparatus for light-emitting diode chip of claim 7, wherein the conductive films are disposed between the substrate and the light-emitting diode chip.

10. The detection apparatus for light-emitting diode chip of claim 7, wherein the conductive films are disposed over the substrate and the light-emitting diode chip.

11. The detection apparatus for light-emitting diode chip of claim 1, wherein the substrate is a solar panel or a photodetector array.

12. The detection apparatus for light-emitting diode chip of claim 11, wherein the photodetector array is an array of photoelectric diodes, charge coupled devices (CCDs), quantum optical detectors, photoelectric gates, light dependent resistances, phototransistors, or photoconductors.

13. The detection apparatus for light-emitting diode chip of claim 1, wherein a film with adhesive property is disposed between the substrate and the light-emitting diode chip, and a grip ring is further disposed on the film to expand the film.

\* \* \* \* \*